(12) United States Patent
Kamil et al.

(10) Patent No.: US 12,386,072 B2
(45) Date of Patent: Aug. 12, 2025

(54) OPTICAL SENSOR

(71) Applicant: Robert Bosch GmbH, Stuttgart (DE)

(72) Inventors: Mustafa Kamil, Ludwigsburg (DE); Nico Heussner, Karlsruhe (DE)

(73) Assignee: ROBERT BOSCH GMBH, Stuttgart (DE)

(*) Notice: Subject to any disclaimer, the term of this patent is extended or adjusted under 35 U.S.C. 154(b) by 780 days.

(21) Appl. No.: 17/640,229

(22) PCT Filed: Sep. 4, 2020

(86) PCT No.: PCT/EP2020/074837
§ 371 (c)(1),
(2) Date: Mar. 3, 2022

(87) PCT Pub. No.: WO2021/048029
PCT Pub. Date: Mar. 18, 2021

(65) Prior Publication Data
US 2022/0317303 A1    Oct. 6, 2022

(30) Foreign Application Priority Data

Sep. 11, 2019   (DE) ............. 10 2019 213 812.8

(51) Int. Cl.
*G01S 17/89*    (2020.01)
*G01S 7/481*    (2006.01)
(Continued)

(52) U.S. Cl.
CPC .......... *G01S 17/894* (2020.01); *G01S 7/4816* (2013.01); *G01S 7/4863* (2013.01); *G01S 17/08* (2013.01); *G01S 17/86* (2020.01); *H04N 23/20* (2023.01)

(58) Field of Classification Search
CPC .... G01S 17/894; G01S 7/4816; G01S 7/4863; G01S 17/08; G01S 17/86; G01S 17/10;
(Continued)

(56) References Cited

U.S. PATENT DOCUMENTS 6,728,009 B1    4/2004 Hemmings et al.
2002/0181033 A1    12/2002 Tandon et al.
(Continued)

FOREIGN PATENT DOCUMENTS

CN    101562693 A    10/2009
DE    10048656 A1    4/2002
(Continued)

OTHER PUBLICATIONS

International Search Report for PCT/EP2020/074837, Issued Jan. 18, 2021.

*Primary Examiner* — Tony Ko
(74) *Attorney, Agent, or Firm* — NORTON ROSE FULBRIGHT US LLP

(57) ABSTRACT

An optical sensor includes first and second light detectors, an optical path, and an evaluation unit. The first light detector detects light in the infrared wavelength range. A light sensitivity of the CCD sensors of the first and second light detectors differ from one another with regard to a predefined wavelength range. The first and second light detectors include pixels in columns and situated next to one another so that a first longitudinal side of the first light detector adjoins a first longitudinal side of the second light detector, and the first and second light detectors receive light via the optical path. The first and second light detectors generate first and second measuring signals, respectively, from electrical charges. The evaluation unit receives the first measuring signals at a first sampling frequency and the (Continued)

second measuring signals at a second sampling frequency, and combines these to form an output signal.

10 Claims, 2 Drawing Sheets

(51) Int. Cl.
    *G01S 7/4863*     (2020.01)
    *G01S 17/08*     (2006.01)
    *G01S 17/86*     (2020.01)
    *G01S 17/894*     (2020.01)
    *H04N 23/20*     (2023.01)

(58) Field of Classification Search
    CPC ......... G01S 17/42; G01S 17/89; H04N 23/20; H04N 25/131; H04N 25/701; H04N 25/705; H04N 25/71; H10F 39/157; H10F 39/803
    See application file for complete search history.

(56) References Cited

U.S. PATENT DOCUMENTS

| | | |
|---|---|---|
| 2006/0146154 A1 | 7/2006 | Angal et al. |
| 2008/0111894 A1* | 5/2008 | Tanimoto ............. H04N 23/843 348/222.1 |
| 2016/0240579 A1 | 8/2016 | Sun et al. |
| 2018/0120436 A1 | 5/2018 | Smits |

FOREIGN PATENT DOCUMENTS

| | | |
|---|---|---|
| DE | 60026201 T2 | 8/2006 |
| DE | 102009060392 A1 | 6/2011 |
| DE | 102010063960 A1 | 6/2012 |
| DE | 102016104368 A1 | 10/2016 |
| FR | 2740558 A1 | 4/1997 |
| WO | 0117838 A1 | 3/2001 |

* cited by examiner

OPTICAL SENSOR

FIELD

The present invention relates to an optical sensor, in particular an optical sensor based on CCD technology.

BACKGROUND INFORMATION

Conventional optical sensors based on different technologies, for example CCD detectors, CMOS detectors, SPAD detectors, etc., from the related art may be used to detect electromagnetic radiation. While CCD and CMOS detectors are usually used for RGB image detection in camera systems, SPAD detectors are frequently used in conjunction with lidar sensors. In addition, conventional means of transportation (i.e., transportation devices) from the related art may detect the surroundings based on cameras and/or based on lidar systems.

German Patent Application No. DE 10 2009 060 392 A1 describes a sensor device for arrangement at an inner side of a window of a motor vehicle, with at least one sensor for receiving and/or transmitting electromagnetic radiation, including a first housing module for accommodating a processing unit and a second housing module for accommodating the at least one sensor. In one preferred specific embodiment, a lidar sensor made up of a laser transmitter and a laser receiver, as well as a camera are situated in the second housing module. The laser transmitter may preferably be a pulsed laser that is made up of a predefined number of laser diodes that are connected to one another to form a stack.

PCT Patent Application No. WO 01/17838 A1 describes a method for monitoring a hazard area for endangered and/or dangerous objects by use of an image recording device, an image recording taking place based on multiple sensors in order to increase the reliability and informative value. One presented exemplary embodiment of the cited invention is based on a combination of the advantages of an automatic stereoscopic evaluation of a stereoscopic image pair, and spatial data collection with the aid of three-dimensional laser measuring technology.

U.S. Patent Application Publication No. US 2016/240579 A1 describes an optical sensor that includes a pixel array made up of a plurality of pixels for detecting visible light and a plurality of pixels for detecting infrared light, the pixels for detecting infrared light detecting in particular time-of-flight (TOF) information of emitted infrared light. In one preferred specific embodiment of the sensor according to the cited invention, the particular sensor pixels are stacked on a single die, and include separate lines for reading out the respective sensor information.

It is an object of the present invention to provide an optical sensor that is configured to enable lidar-based depth detection and RGB-based color detection based on combined CCD sensors.

SUMMARY

The present invention provides an optical sensor that includes a first light detector, a second light detector, an optical path, and an evaluation unit. In accordance with an example embodiment of the present invention, the first light detector is configured to detect light in the infrared wavelength range. The light in the infrared wavelength range may preferably be generated with the aid of an infrared laser source of the optical sensor and emitted into the surroundings of the optical sensor. Portions of the infrared laser light that are reflected and/or scattered by the surroundings to the first light detector may thus be used for an active measurement by the first light detector. The light in the infrared wavelength range, detected by the first light detector and/or by the second light detector, may also preferably be pulsed and/or continuous-wave laser light.

In accordance with an example embodiment of the present invention, the first light detector and the second light detector are each charge-coupled device (CCD) sensors, a light sensitivity of the CCD sensor of the first light detector differing from a light sensitivity of the CCD sensor of the second light detector with regard to a predefined wavelength range. For the case that both the first light detector and the second light detector are designed for an essentially identical wavelength range (for example, both as infrared light detectors), according to the present invention one of the two light detectors thus has less sensitivity in this wavelength range. For the case that the first light detector and the second light detector are designed for different wavelength ranges (for example, an infrared light detector and an RGB light detector for visible light), according to the present invention the first light detector has less (or also no) light sensitivity for the wavelength range of the second light detector, and vice versa. In addition, the first light detector and the second light detector each include pixels that are arranged in columns and situated next to one another in such a way that a first longitudinal side of the first light detector adjoins a first longitudinal side of the second light detector. Respective pixel columns of the first light detector and of the second light detector may each include one- or two-dimensional arrangements of pixels. Due to the proximity of the pixel columns of the first light detector and of the second light detector, the two light detectors are configured to simultaneously receive light from the surroundings of the optical sensor via the jointly used optical path. The optical sensor, in conjunction with the first light detector, is configured to generate first measuring signals from electrical charges that are generated when light strikes the first light detector, and in conjunction with the second light detector to generate second measuring signals from electrical charges that are generated when light strikes the second light detector.

The evaluation unit, which may be designed, for example, as an ASIC, FPGA, processor, digital signal processor, microcontroller, or the like, is configured to receive the first measuring signals at a first sampling frequency and the second measuring signals at a second sampling frequency, and to combine these to form an output signal. The output signal may preferably be an overall signal that is generated from the first measuring signal and the second measuring signal. Alternatively or additionally, the output signal may include the first measuring signal and the second measuring signal as separate measuring signals. Furthermore, the first sampling frequency and the second sampling frequency may be identical or different frequencies. A connection of the evaluation unit according to the present invention to the optical sensor using information technology may preferably take place via an A/D converter that is configured to convert the charge quantities, generated by the first light detector and the second light detector, into corresponding digital signals. This may take place via an A/D converter that is jointly used by the first and second light detectors, or via separate A/D converters in each case for the respective light detectors. In addition, the A/D converter may be an integral part of the optical sensor itself, or may be an integral part of the evaluation unit. Furthermore, the evaluation unit may be an integral part of the optical sensor. In addition, a signal amplifier may advantageously be connected upstream from a respective A/D converter.

The optical path may be understood as a light incidence path between an inlet opening (in a housing, for example) of the optical sensor and respective sensor pixels of the first and second light detectors. Optical elements such as lenses, lens systems, mirrors, etc., may preferably be situated within the optical path for optimally adapting (for example, bundling, deflecting, splitting, etc.) the light entering the optical sensor.

Preferred refinements of the present invention are disclosed herein.

In one advantageous embodiment of the present invention, the optical sensor is a rotational scanner, and/or the evaluation unit is configured to generate in each case, from a plurality of first measuring signals and a plurality of second measuring signals of a particular scanning operation, respective light detector-based overall images and/or a sensor-based overall image of the surroundings of the optical sensor, and to output same in the form of the output signal. With the aid of a rotating scanning movement of a conventional rotational scanner, the optical sensor according to the present invention is configured to sequentially sample the surroundings of the optical sensor. The evaluation unit may be configured, for example based on a computer program that is executed by the evaluation unit, to combine respective single images, provided in columns, to form an overall image of the surroundings.

In a further advantageous embodiment of the present invention, the optical sensor additionally includes a first transfer register and/or a second transfer register, the first transfer register and/or the second transfer register in each case including at least one pixel column that adjoins a second longitudinal side of the first light detector and/or a second longitudinal side of the second light detector. In addition, the first transfer register and the second transfer register are configured to temporarily store electrical charges that are generated by the first light detector and/or by the second light detector, and sequentially output them to the evaluation unit in a clocked manner. Following the CCD sensor principle from the related art, the respective transfer registers are situated in a light-protected area of the optical sensor, so that light entering through the optical path has no effects at all on the transfer registers. Depending on the particular application of the optical sensor according to the present invention, it may be advantageous to provide only the first transfer register or only the second transfer register, or correspondingly, both transfer registers, in order to transport the charges, generated by the light detectors, from the area of the respective light detector surfaces outward for a subsequent readout operation.

In a further advantageous embodiment of the present invention, the first transfer register and the second transfer register have an identical number or a different number of pixel columns. The number of respective pixel columns of the first transfer register and/or of the second transfer register is preferably based on a characteristic of light to be detected in each case and/or a particular sampling frequency of the respective light detectors. If pulsed laser light is used to illuminate the surroundings of the optical sensor, the number of pixel columns for a transfer register, respectively affected by the infrared light reception, may preferably be selected in such a way that at least one pulse width of the pulsed laser light may be completely maintained in the respective transfer register.

In a further advantageous embodiment of the present invention, the second light detector is configured to detect light in the visible wavelength range, and the evaluation unit is additionally configured, based on the first measuring signal and based on the second measuring signal, to generate an output signal that includes depth information as well as color information concerning the surroundings detected by the optical sensor. The measurement of the visible light by the second light detector preferably represents a passive measurement, although it is also possible to additionally illuminate the surroundings by using a light source for the visible wavelength range, which may also make it possible for the second light detector to carry out an active measurement.

In a further advantageous embodiment of the present invention, the second light detector is configured to detect light in the infrared wavelength range, and the evaluation unit is additionally configured, based on the first measuring signal and the second measuring signal, to generate an output signal that encompasses an expanded dynamic range with regard to the first measuring signal or with regard to the second measuring signal. Due to the different sensitivities of the first light detector and the second light detector according to the present invention, the evaluation unit may, for example, use less strongly exposed areas of the surroundings from the respective measuring signal of the more light-sensitive light detector, while it may use the more strongly exposed areas of the surroundings from the respective measuring signal of the less light-sensitive light detector. A suitable algorithm for combining the two measuring signals may be based, for example, on a conventional algorithm from the related art, for generating so-called high dynamic range (HDR) images.

In a further advantageous embodiment of the present invention, the first light detector and the second light detector in each case include/have identical or different semiconductor materials and/or exposure times and/or orientations with regard to the optical path and/or attenuation filters (gray filters, for example) and/or sampling frequencies and/or resolutions and/or pixel sizes. In particular as the result of deviations between one or more of the above-mentioned technical properties of the respective light detectors, suitable expansions of the dynamic range may be achieved when two infrared light detectors are used. In addition, different technical properties between the two light detectors may also be utilized to advantageously form the above-described combination of an infrared light detector and an RGB light detector on an application-specific basis. In the case of an infrared/RGB light detector combination, it may be particularly advantageous to optimally orient the first light detector (i.e., the infrared light detector) on the optical path (i.e., perpendicularly with respect to the optical path) to enable a maximum light yield for this light detector, while the RGB light detector may thus have a correspondingly small deviation from the optimal orientation with respect to the optical path.

In a further advantageous embodiment of the present invention, the first light detector and the second light detector may be provided jointly on the same substrate or on separate substrates. In addition, the first light detector and/or the second light detector may be manufactured based on silicon or indium phosphide or gallium arsenide. For an embodiment of the first light detector and of the second light detector based on the same semiconductor material, in particular silicon may be used due to its suitability for detection in the infrared wavelength range and also in the visible wavelength range. Production steps, and thus associated manufacturing costs, may be reduced by using the same semiconductor material.

Furthermore, higher integration and thus a reduction in the size of the optical sensor may thus be made possible.

Due to the simultaneous RGB image detection and distance measurement proposed here, based on a CCD lidar system, among other things it is possible to achieve optimal time synchronization of color and depth information. Furthermore, adjustment and calibration efforts for the different light detectors may be dispensed with, since they are able to receive light, to be detected, via the same optical path.

BRIEF DESCRIPTION OF THE DRAWINGS

Exemplary embodiments of the present invention are described in greater detail below with reference to the figures.

DETAILED DESCRIPTION OF EXAMPLE EMBODIMENTS

Figure 1:
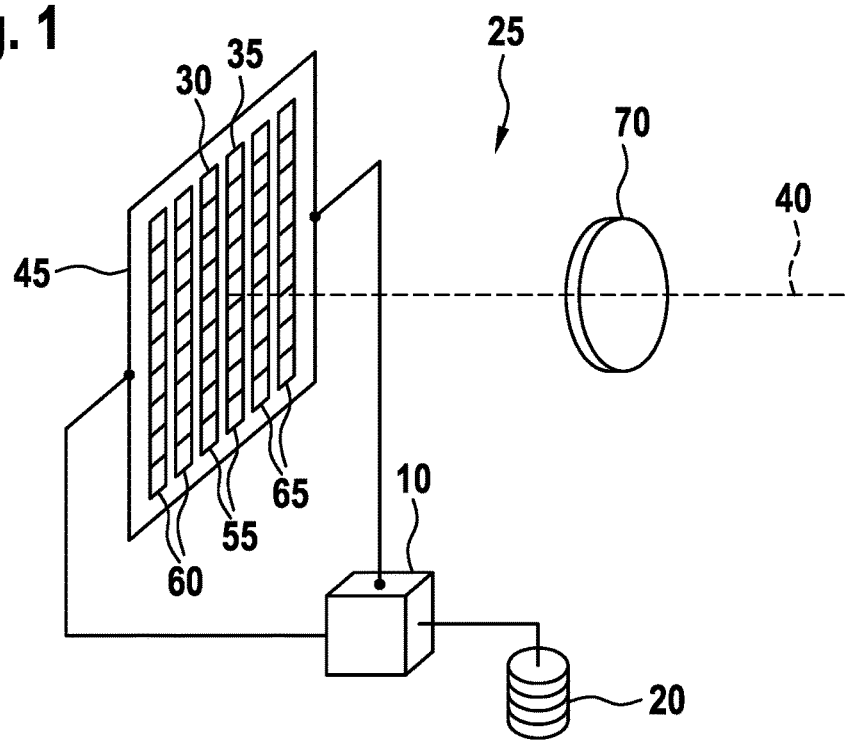
FIG. 1 shows a schematic overview of an optical sensor according to an example embodiment of the present invention.

FIG. 1 shows a schematic overview of an optical sensor 25 according to the present invention, which is a rotational scanner here. Optical sensor 25 includes a light detector unit 45 comprising a first light detector 30 and a second light detector 35. In the present case, first light detector 30 is a light detector for the infrared wavelength range, while second light detector 35 is a light detector for the visible wavelength range. First light detector 30 and second light detector 35 each include a one-dimensional pixel column 55, in each case made up of a plurality of detector pixels 50. Pixel column 55 of first light detector 30 is oriented with respect to an optical path 40 (light incidence path) of optical sensor 25 in such a way that the surface normal of pixel column 55 of first light detector 30 extends in parallel to optical path 40. Optical path 40 here includes a lens system 70 that focuses light entering optical sensor 25. A first transfer register 60 and a second transfer register 65 are situated adjacent to light detectors 30, 35, respectively, and are configured to transport the charges, generated by light detectors 30, 35, outward from a light-sensitive area of light detectors 30, 35. Image information represented by the charges is thus transported from a middle area of light detector unit 45 to the respective sides of light detector unit 45. At this location the charge quantities are converted into first and second digital measuring signals via a combination of respective signal amplifiers and A/D converters (not shown) and transmitted to an evaluation unit 10 according to the present invention, which is connected to the A/D converters using information technology. Evaluation unit 10 stores the received measuring signals in a memory unit 20 that is connected to evaluation unit 10 using information technology. After sampling of the surroundings of optical sensor 25 is complete, evaluation unit 10 computes an overall image of the surroundings in the form of a 3D color image, based on the measuring signals stored in memory unit 20.

Figure 2:
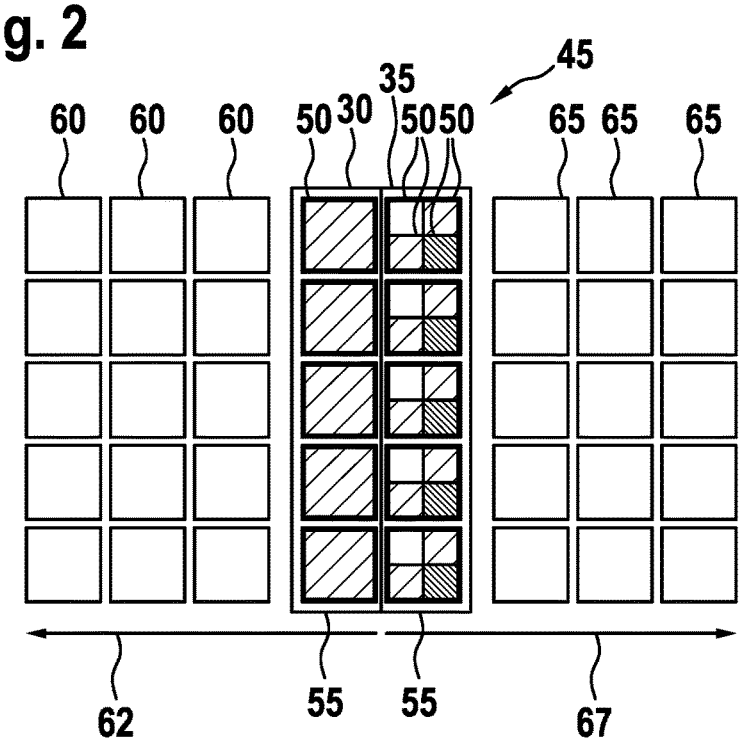
FIG. 2 shows a first specific embodiment of a light detector unit of an optical sensor according to the present invention.

FIG. 2 shows a first specific embodiment of a light detector unit 45 of an optical sensor according to the present invention in the form of a rotational scanner. Detector unit 45 includes a first light detector 30 for detecting light in the infrared wavelength range, which in the present case is a lidar sensor, and a second light detector 35 (RGB sensor) for detecting light in the visible wavelength range. The same as in FIG. 1, an overall image of the surroundings of the optical sensor results from rotating respective pixel columns 55 and combining respective detected column images. In order to take into account for the different propagation times that are necessary for the different measurements, in the case of the lidar sensor the electrons generated by the incident light migrate away to the left (first transfer direction 62) via first transfer register 60. This allows a correspondingly high sampling frequency, which is necessary for sampling a lidar pulse in the case of a time-of-flight (TOF) measuring principle. For the RGB sensor, due to the integration-based measuring principle (imager principle) a comparatively longer integration time within individual pixels 50, and thus a lower sampling frequency, are necessary. In the case of the RGB sensor, the electrons generated by the incident light migrate away to the right (second transfer direction 67) via second transfer register 65. FIG. 2 shows one specific embodiment with different pixel sizes between first light detector 30 and second light detector 35. Complete color information may thus be provided for each "lidar pixel" 50.

Figure 3:
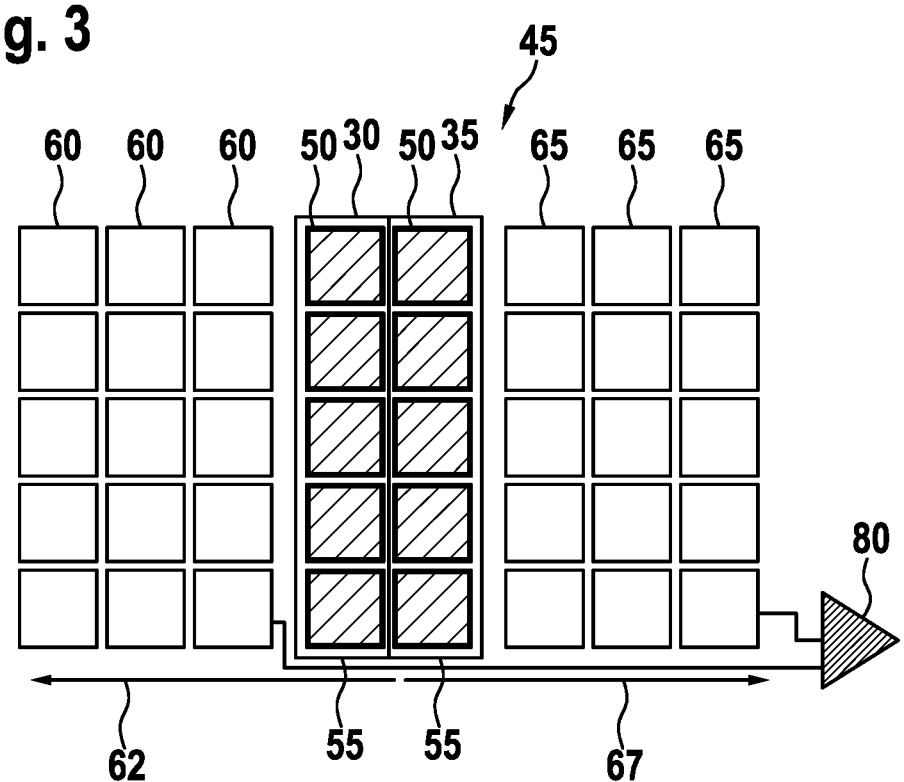
FIG. 3 shows a second specific embodiment of a light detector unit of an optical sensor according to the present invention.

FIG. 3 shows a second specific embodiment of a light detector unit 45 of an optical sensor according to the present invention in the form of a rotational scanner. Detector unit 45 includes a first light detector 30 and a second light detector 35, each of which is configured to detect light in the infrared wavelength range. Although the second specific embodiment provides identical pixel sizes of particular detector pixels 50 in respective pixel columns 55 of first light detector 30 and of second light detector 35, respective light detectors 30, 35 operate here at different sampling frequencies. This results in integration times of different lengths within detector pixels 50 of respective light detectors 30, 35, which results in different sensitivities of respective light detectors 30, 35. The electrons released due to light entering light detectors 30, 35 are conducted in a first transfer direction 62 via a first transfer register 60, and in a second transfer direction 67 via a second transfer register 65, in a respective light detector-specific clocking, to an A/D converter 80 which subsequently generates a first digital measuring signal for first light detector 30 and a second digital measuring signal for second light detector 35. Based on the two measuring signals, an evaluation unit according to the present invention (not shown) may subsequently compute an overall image of the surroundings of optical sensor 25 with an expanded dynamic range.

Figure 4:
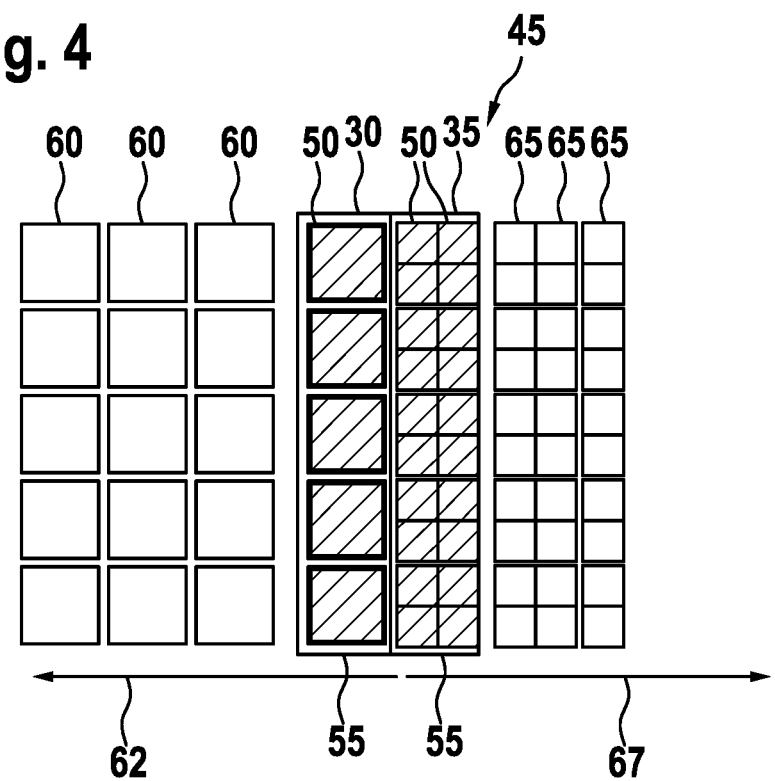
FIG. 4 shows a third specific embodiment of a light detector unit of an optical sensor according to the present invention.

FIG. 4 shows a third specific embodiment of a detector unit 45 of an optical sensor according to the present invention in the form of a rotational scanner. Detector unit 45 includes a first light detector 30 and a second light detector 35, each of which is configured to detect light in the infrared wavelength range. In contrast to FIG. 2, second light detector 35 has four times more detector pixels 50 in pixel columns 55 than first light detector 30. Similarly, the number of pixels of respective corresponding transfer registers 60, 65, which transport charges, generated by the incidence of light, in first light detector 30 and in second light detector 35 outward in the direction of corresponding transfer directions 62, 67, are different. In this way, different sensitivities of respective light detectors 30, 35 may also be created, since due to the different areas of detector pixels 50 in the same time period, more photons (larger pixels) or fewer photons (smaller pixels) are received, as a result of which one of the resulting measuring signals is suitable for detecting strongly illuminated objects, and a respective other of the resulting measuring signals is suitable for detecting weakly illuminated objects. An evaluation unit according to the present invention (not shown) subsequently combines the two measuring signals to form an overall image having an increased dynamic range.

What is claimed is:

1. An optical sensor, comprising:
  a first light detector configured to detect light in the infrared wavelength range;
  a second light detector;
  an optical path; and
  an evaluation unit;
  wherein each of the first light detector and the second light detector:
    is a CCD sensor, a light sensitivity of the CCD sensor of the first light detector differing from a light sensitivity of the CCD sensor of the second light detector with regard to a predefined wavelength range,
    includes pixels that are arranged in columns and situated next to one another in such a way that a first longitudinal side of the first light detector adjoins a first longitudinal side of the second light detector, and
    is configured to receive light via the optical path;
  wherein the optical sensor, in conjunction with the first light detector, is configured to generate first measuring signals from electrical charges, and in conjunction with the second light detector, is configured to generate second measuring signals from electrical charges; and
  wherein the evaluation unit is configured to receive the first measuring signals at a first sampling frequency and the second measuring signals at a second sampling frequency, and to combine together the first measuring signals and the second measuring signals to form an output signal.

2. The optical sensor as recited in claim 1, wherein:
  the optical sensor is a rotational scanner, and/or
  the evaluation unit, from a plurality of the first measuring signals and a plurality of the second measuring signals of a particular scanning operation, is configured to generate respective light detector-based overall images, and/or
    generate a sensor-based overall image of surroundings of the optical sensor and output it in the form of the output signal.

3. The optical sensor as recited in claim 1, further comprising:
  a first transfer register, and/or a second transfer register, each of the first transfer register and/or the second transfer register:
    including at least one pixel column that adjoins a second longitudinal side of the first light detector and/or a second longitudinal side of the second light detector, and
    being configured to temporarily store electrical charges that are generated by the first light detector and/or the second light detector, and sequentially output the electrical charges to the evaluation unit in a clocked manner.

4. The optical sensor as recited in claim 3, wherein:
  the first transfer register and the second transfer register have an identical number or a different number of pixel columns, and/or
  a number of respective pixel columns of the first transfer register and/or of the second transfer register is based on:
    a characteristic of light to be detected in each case, and/or
    a particular sampling frequency of a respective one of the light detectors.

5. The optical sensor as recited in claim 1, wherein:
  the second light detector is configured to detect light in a visible wavelength range, and
  the evaluation unit is configured, based on the first measuring signal and the second measuring signal, to generate an output signal that includes depth information and color information concerning surroundings detected by the optical sensor.

6. The optical sensor as recited in claim 1, wherein:
  the second light detector is configured to detect light in the infrared wavelength range, and
  the evaluation unit is configured, based on the first measuring signal and the second measuring signal, to generate an output signal that encompasses an expanded dynamic range with regard to the first measuring signal or with regard to the second measuring signal.

7. The optical sensor as recited in claim 1, wherein the first light detector and the second light detector in each case include identical or different:
  semiconductor materials, and/or
  exposure times, and/or
  orientations with regard to the optical path, and/or
  attenuation filters, and/or
  sampling frequencies, and/or
  resolutions, and/or
  pixel sizes.

8. The optical sensor as recited in claim 1, wherein the light in the infrared wavelength range, detected by the first light detector and/or second light detector, is pulsed and/or continuous-wave laser light that is emitted by the optical sensor into surroundings of the optical sensor.

9. The optical sensor as recited in claim 1, wherein the first light detector and the second light detector are provided jointly on the same substrate, or on separate substrates.

10. The optical sensor as recited in claim 1, wherein the first light detector and/or the second light detector is in each case manufactured based on silicon or indium phosphide, or gallium arsenide.

* * * * *